United States Patent
Nakazawa et al.

(10) Patent No.: US 9,972,499 B2
(45) Date of Patent: *May 15, 2018

(54) METHOD FOR FORMING METAL-SEMICONDUCTOR ALLOY USING HYDROGEN PLASMA

(71) Applicant: FUJI ELECTRIC CO., LTD., Kawasaki-shi, Kanagawa (JP)

(72) Inventors: Haruo Nakazawa, Kawasaki (JP);
Masaaki Ogino, Kawasaki (JP);
Tsunehiro Nakajima, Kawasaki (JP);
Kenichi Iguchi, Kawasaki (JP);
Masaaki Tachioka, Kawasaki (JP);
Kiyokazu Nakagawa, Kofu (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days. days.

This patent is subject to a terminal disclaimer.

(21) Appl. No.: 15/065,809

(22) Filed: Mar. 9, 2016

(65) Prior Publication Data
US 2016/0189967 A1 Jun. 30, 2016

Related U.S. Application Data

(63) Continuation of application No. PCT/JP2015/061899, filed on Apr. 17, 2015.

(30) Foreign Application Priority Data

Apr. 18, 2014 (JP) .................................. 2014-086709

(51) Int. Cl.
*H01L 21/285* (2006.01)
*H01L 29/66* (2006.01)
(Continued)

(52) U.S. Cl.
CPC ...... *H01L 21/28518* (2013.01); *H01L 21/043* (2013.01); *H01L 21/0485* (2013.01);
(Continued)

(58) Field of Classification Search
CPC ........... H01L 21/0485; H01L 21/28518; H01L 21/3003; H01L 29/665; H01L 29/66068
See application file for complete search history.

(56) References Cited

U.S. PATENT DOCUMENTS 6,004,872 A * 12/1999 Tezuka .................... C23C 16/10
257/E21.165
9,548,205 B2 * 1/2017 Nakazawa ........ H01L 29/66068
(Continued)

FOREIGN PATENT DOCUMENTS

| CN | 1631776 A | 6/2005 |
|---|---|---|
| JP | 2008-135635 A | 6/2008 |

(Continued)

OTHER PUBLICATIONS

Machine Translation of Chinese Application No. 1631776.*
(Continued)

*Primary Examiner* — Daniel Luke
(74) *Attorney, Agent, or Firm* — Rabin & Berdo, P.C.

(57) ABSTRACT

A method of manufacturing a semiconductor device includes providing a semiconductor substrate having a front surface and a back surface; forming a transition metal layer on a surface of the semiconductor substrate; and exposing the semiconductor substrate having the transition metal layer formed thereon to a hydrogen plasma atmosphere formed by microwaves, to cause the transition metal layer to generate heat. During exposure of the semiconductor substrate, a portion of the semiconductor substrate contacting the transition metal layer is heated by a transfer of heat from the transition metal layer and, at an interface of the transition (Continued)

metal layer and the semiconductor substrate, an ohmic contact is formed by reaction of the transition metal layer and the semiconductor substrate, such as to form a transition metal silicide when the semiconductor substrate is silicon carbide. The ohmic contact provides a lower contact resistivity and device properties can be prevented from degrading.

14 Claims, 9 Drawing Sheets

(51) Int. Cl.
      *H01L 29/16*       (2006.01)
      *H01L 21/04*       (2006.01)
      *H01L 29/45*       (2006.01)
      *H01L 21/28*       (2006.01)
      *H01L 29/78*       (2006.01)

(52) U.S. Cl.
    CPC .......... *H01L 21/28* (2013.01); *H01L 29/1608* (2013.01); *H01L 29/45* (2013.01); *H01L 29/665* (2013.01); *H01L 29/66068* (2013.01); *H01L 29/78* (2013.01); *H01L 2924/0002* (2013.01)

(56) References Cited

U.S. PATENT DOCUMENTS

| | | | |
|---|---|---|---|
| 9,564,334 B2* | 2/2017 | Iguchi | H01L 29/1608 |
| 2008/0124922 A1 | 5/2008 | Kawamura et al. | |
| 2008/0145988 A1* | 6/2008 | Jeon | H01L 21/28052 438/294 |
| 2008/0242059 A1* | 10/2008 | McSwiney | C23C 16/18 438/475 |
| 2009/0053867 A1* | 2/2009 | Enda | H01L 21/28518 438/264 |
| 2010/0155808 A1 | 6/2010 | Makihara et al. | |
| 2012/0171863 A1 | 7/2012 | Suzuki et al. | |
| 2012/0326167 A1 | 12/2012 | Tamaso | |
| 2013/0115780 A1 | 5/2013 | Okumura et al. | |
| 2014/0021623 A1* | 1/2014 | Tenaglia | H01L 21/0272 257/773 |

FOREIGN PATENT DOCUMENTS

| | | |
|---|---|---|
| JP | 2009-177102 A | 8/2009 |
| JP | 2011-066060 A | 3/2011 |
| JP | 2012-099599 A | 5/2012 |
| JP | 2012-246216 A | 12/2012 |
| JP | 2013-070100 A | 4/2013 |
| JP | 2013-120633 A | 6/2013 |
| WO | WO-2009-118783 A1 | 10/2009 |

OTHER PUBLICATIONS

Makihara K. et al., "Self-Assembling Formation of Ni Nanodots on SiO2 Induced by Remote H2 Plasma Treatment and Their Electrical Charging Characteristics", Japanese Journal of Applied Physics, vol. 47, No. 4, pp. 3099-3102, Apr. 25, 2008.
Nakagawa K., "New Heating Method for Polycrystallization of Amorphous Si Using Microwave Plasma Irradiation", ECS Transactions, 16(10), 905-908(2008), The Electrochemical Society.
Nakaie H. et al., "Formation of Polycrystalline Si Films for Thin-film Transistors by Selective Heating Method of Transition Metal with Hydrogen Radical Irradiation", Extended abstracts of The 74th Japan Society of Applied Physics Autumn Meeting, 17p—p. 2-47, 2013.
Nakamura H. et al., "Development of Heating Method of Transition Metal using Hydrogen Plasma (II)", Extended abstracts of The 59th Japan Society of Applied Physics and Related Societies Spring Meeting, 16a-A6-9, 2012.
Miyazaki S. et al., "Fabrication of Metal Silicide Nanodots and Hybrid Stacked Structure in Combination with Silicon Quantum Dots for Floating Gate Application", Proceedings of The 3rd Asian Physics Symposium (APS 2009), pp. 13-17, Jul. 22-23, 2009.

* cited by examiner

METHOD FOR FORMING METAL-SEMICONDUCTOR ALLOY USING HYDROGEN PLASMA

CROSS REFERENCE TO RELATED APPLICATIONS

This is non-provisional application is a continuation of International Application PCT/JP2015/061899 filed on Apr. 17, 2015, which claims priority from Japanese Patent Application No. 2014-086709 filed on Apr. 18, 2014, the contents of both of which are incorporated herein by reference.

BACKGROUND OF THE INVENTION

1. Field of the Invention

The embodiments discussed herein are related to a method of manufacturing a semiconductor device.

2. Description of the Related Art

Conventionally, in a semiconductor device (semiconductor apparatus) that uses (Si) semiconductor, a silicon carbide (SiC) semiconductor, etc., an ohmic contact (electrical contact portion) of a semiconductor portion and a transition metal layer (electrode) is formed by heat treatment (annealing). Here, a method of forming an ohmic contact in a conventional semiconductor device will be described taking an example where a nickel (Ni) contact electrode is formed on a silicon carbide semiconductor substrate (hereinafter, silicon carbide substrate).

FIG. 23 is a flowchart outlining a conventional method of manufacturing a semiconductor device. FIGS. 24, 25, 26, 27, and 28 are cross-sectional views of states of a conventional semiconductor device during manufacture. As depicted in FIG. 24, an interlayer insulating film 102 is formed in a front surface of a silicon carbide substrate 101. Next, a contact hole 103 is formed penetrating the interlayer insulating film 102 in a direction of depth, to reach the silicon carbide substrate 101 (step S101). Next, as depicted in FIG. 25, in the front surface of the silicon carbide substrate 101, a substantially 100% pure nickel layer (hereinafter, pure nickel layer) 104 is formed by a sputtering method, a vapor deposition method, etc. so as to be embedded in the contact hole 103 (step S102).

Next, as depicted in FIG. 26, by photolithography and etching, the pure nickel layer 104 is patterned and is left inside the contact hole 103 (step S103). Next, as depicted in FIG. 27, a pure nickel layer 105 is formed in a back surface of the silicon carbide substrate 101 by a sputtering method, a vapor deposition method, etc. (step S104). Next, as depicted in FIG. 28, by heat treatment at a temperature of 900 degrees C. or greater, the silicon carbide substrate 101 and the pure nickel layers 104, 105 are reacted to form a silicide layer 106 (step S105). Furnace annealing, laser annealing, lamp annealing, induction heating, etc. may be used for the heat treatment at step S105.

To form such an ohmic contact, a method has been proposed that includes a process of depositing a transition metal layer on a surface of a semiconductor substrate formed of a silicon semiconductor (hereinafter, silicon substrate) and a process of heat treating the transition metal layer, where in the heat treatment process, the entire silicon substrate is heated at a temperature of 400 to 750 degrees C. for 30 to 90 seconds (for example, refer to Japanese Laid-Open Patent Publication No. 2012-246216).

Another method has been proposed where a transition metal layer is vapor deposited on a contact on a silicon carbide substrate and the entire silicon carbide substrate is heated by rapid heat treatment at a temperature of 1000 degrees C. for 2 minutes to form a silicide electrode of high carbon content (for example, refer to Japanese Laid-Open Patent Publication No. 2009-177102 (paragraph 0017)).

Another method has been proposed where after a nickel layer is formed in a silicon wafer, hydrogen ($H_2$) gas is introduced into a chamber to create a hydrogen gas atmosphere inside the chamber, and a susceptor is heated to 450 to 550 degrees C. to heat treat the silicon wafer (for example, refer to Japanese Laid-Open Patent Publication No. 2011-066060 (paragraphs 0037 to 0040)).

Still another method has been proposed where after a titanium (Ti) layer, an aluminum (Al) layer, and a silicon layer are sequentially formed on a silicon carbide substrate by sputtering to form a contact electrode, the titanium, aluminum, and silicon included in the contact electrode form an alloy with the silicon and the carbon included in the silicon carbide substrate by annealing using laser light (for example, refer to Japanese Laid-Open Patent Publication No. 2012-099599 (paragraphs 0042 to 0044)).

Yet another method has been proposed where an oxide film ($SiO_2$), quantum dots formed from silicon, and a nickel (Ni) thin film are sequentially stacked on a silicon substrate and subject to remote hydrogen plasma processing for 5 minutes at a frequency of 60 MHz and a very high frequency (VHF) electrical power of 200 W to 500 W to form nickel silicide (NiSi) dots from a stacked film formed from the quantum dots and nickel thin film (for example, refer to Republished Japanese-Translation of PCT Application, Publication No. 2009-118783 (paragraphs 0056 to 0061) and K. Makihara, et al, "Self-Assembling Formation of Ni Nanodots on $SiO_2$ Induced by Remote $H_2$ Plasma Treatment and Their Electrical Charging Characteristics", Japanese Journal of Applied Physics, Japan Society of Applied Physics, 2008.04, Vol. 47, No. 4, pp. 3099-3102).

Nonetheless, in Japanese Laid-Open Patent Publication Nos. 2012-246216, 2009-177102, and 2011-066060, the portion forming the ohmic contact (i.e., the transition metal layer, or the interface of the substrate and the transition metal layer) cannot be selectively heated; rather the entire substrate (the entire device) is uniformly heated. For example, when an ohmic contact of a silicon carbide semiconductor portion and a transition metal layer is formed, as described above, heat treatment at a high temperature of 1000 degrees C. or greater is performed. Therefore, interface properties of the semiconductor portion and gate insulating film, the material configuring the device, etc. may degrade. In Japanese Laid-Open Patent Publication No. 2012-099599, by reducing the spot diameter of the laser 105, a predetermined region can be selectively irradiated and therefore, the problems associated with Japanese Laid-Open Patent Publication Nos. 2012-246216, 2009-177102, and 2011-066060 can be resolved.

Nonetheless, with Japanese Laid-Open Patent Publication No. 2012-099599, the distance from the converging lens that converges the laser light, to the surface of the transition metal layer has to be constant across the entire transition metal layer. In other words, the device structure has to have a device surface that is flat without unevenness. Therefore, in cases where the distance from the converging lens to the surface of the transition metal layer is not constant consequent to the transition metal layer being disposed in a chip side wall or a trench side wall, throughput may decrease since laser irradiation has to be performed according to conditions corresponding to each irradiation position and therefore, not all of the transition metal layer can be simultaneously heated.

Further, with Japanese Laid-Open Patent Publication No. 2012-099599, since a predetermined region is selectively heated by laser irradiation, programming control for irradiation position, irradiation loci, etc. of the laser is complicated. Furthermore, irradiation voids occur consequent to deviation of the laser irradiation position, whereby contact resistivity becomes inconsistent; and near the transition metal layer, constituent portions (e.g., gate insulating film, etc.) other than the transition metal layer are heated, whereby device properties may degrade. Furthermore, if the surface area of the transition metal layer is smaller than the area corresponding to the spot diameter of the laser, a problem arises in that the transition metal layer cannot be selectively heated alone.

In Republished Japanese-Translation of PCT Application, Publication No. 2009-118783, since the transition metal layer alone generates heat by remote hydrogen plasma processing irrespective of device surface unevenness, transition metal layer patterns, etc., the transition metal layer alone can be uniformly heated. Therefore, problems occurring with selective heating of the transition metal layer by laser irradiation can be resolved. Nonetheless, in Republished Japanese-Translation of PCT Application, Publication No. 2009-118783 and K. Makihara, et al, "Self-Assembling Formation of Ni Nanodots on $SiO_2$ Induced by Remote $H_2$ Plasma Treatment and Their Electrical Charging Characteristics", the mean free path of hydrogen atoms is large and high-density plasma is not created because the pressure is lowered to increase the lifetime of the hydrogen atoms. Therefore, a problem arises in that the hydrogen atom density becomes low and consequently rapid heating is not possible. In practice, in Republished Japanese-Translation of PCT Application, Publication No. 2009-118783, since plasma processing at a low electrical power of 200 W to 500 W is performed for a long period, during the plasma processing, constituent portions other than the transition metal layer (e.g., the entire device) are heated by a transfer of the heat generated by the transition metal layer and as a result, device properties may degrade.

SUMMARY OF THE INVENTION

According to one aspect of disclosure, a method of manufacturing a semiconductor device includes forming a transition metal layer in a surface of a semiconductor substrate; and exposing the semiconductor substrate having the transition metal layer formed thereon to a hydrogen plasma atmosphere formed by microwaves, to cause the transition metal layer to generate heat. In exposing the semiconductor substrate, by a transfer of heat from the transition metal layer, a portion of the semiconductor substrate contacting the transition metal layer is heated, and at an interface of the transition metal layer and the semiconductor substrate, an ohmic contact is formed by reaction of the transition metal layer and the semiconductor substrate.

The method further includes forming on the semiconductor substrate before forming the transition metal layer, a metal layer having a lower melting point than the transition metal layer. In forming the transition metal layer, the transition metal layer is formed to cover the metal layer, and in exposing the semiconductor substrate, the semiconductor substrate having the metal layer and the transition metal layer formed thereon is exposed to the hydrogen plasma atmosphere to cause the transition metal layer to generate heat and heat the metal layer by a transfer of the heat from the transition metal layer.

In the method, forming the transition metal layer includes forming in a front surface of the semiconductor substrate, a first metal layer as the transition metal layer, and forming in a back surface of the semiconductor substrate, a second metal layer as the transition metal layer. In exposing the semiconductor substrate, the first metal layer and the second metal layer are simultaneously exposed to the hydrogen plasma atmosphere.

In the method, forming the transition metal layer includes forming in a front surface of the semiconductor substrate, a first metal layer as the transition metal layer, and forming in a back surface of the semiconductor substrate, a second metal layer as the transition metal layer. The method further includes disposing after forming the transition metal layer and before exposing the semiconductor substrate, a shielding substrate comprising a material other than a transition metal, the shielding substrate disposed covering a surface of the second metal layer. In exposing the semiconductor substrate, the semiconductor substrate having the second metal layer covered by the shielding substrate is exposed to the hydrogen plasma atmosphere. For example, the material of the shielding substrate is preferably quartz.

In the method, in forming the transition metal layer, a thickness of the transition metal layer is set such that the transition metal layer is reacted entirely by exposing the semiconductor substrate. In exposing the semiconductor substrate, the transition metal layer is reacted entirely to end heat generation by the transition metal layer. The thickness of the transition metal layer is at least 10 nm and not more than 200 nm, and preferably at least 20 nm and not more than 100 nm.

In the method, the transition metal layer is an alloy layer comprising a transition metal and silicon.

In the method, the transition metal layer comprises one of or an alloy comprising as a primary component at least one of nickel, titanium, molybdenum, silver, and tungsten.

In the method, the metal layer is one of an aluminum layer, an aluminum alloy layer, a nickel layer, and a nickel alloy layer, and the transition metal layer is one of a titanium layer, a molybdenum layer, and a tungsten layer.

In the method, before forming the transition metal layer, an insulated gate structure contacting an electrical conductor to the semiconductor substrate via an insulating film is formed in the surface of the semiconductor substrate.

In the method, the semiconductor substrate comprises silicon carbide. Then, the reaction of the transition metal layer and the semiconductor substrate forms a transition metal silicide and forms an ohmic contact.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Figure 1:
FIG. 1 is a cross-sectional view of a semiconductor device during manufacture according to a first embodiment.

Preferred embodiments of a method of manufacturing a semiconductor device according to the present invention will be described in detail with reference to the accompanying drawings. In the description of the embodiments below and the accompanying drawings, identical constituent elements will be given the same reference numerals and will not repeatedly be described. Further, in the present description, when Miller indices are described, "−" means a bar added to an index immediately after the "−", and a negative index is expressed by prefixing "−" to the index.

(First Embodiment)

Figure 2:
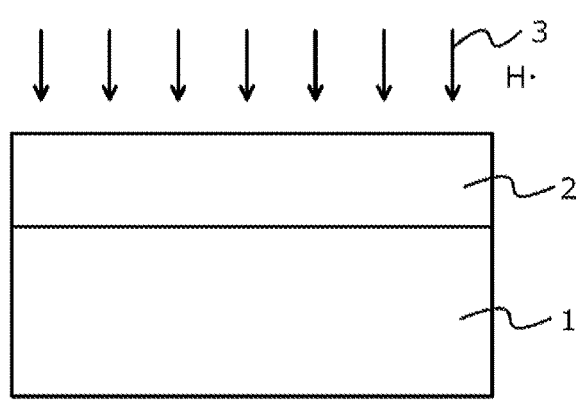
FIG. 2 is a cross-sectional view of the semiconductor device during manufacture according to the first embodiment.
Figure 3A:
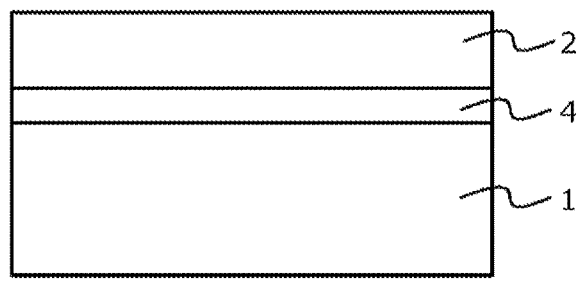
FIG. 3A is a cross-sectional view of the semiconductor device during manufacture according to the first embodiment.
Figure 3B:
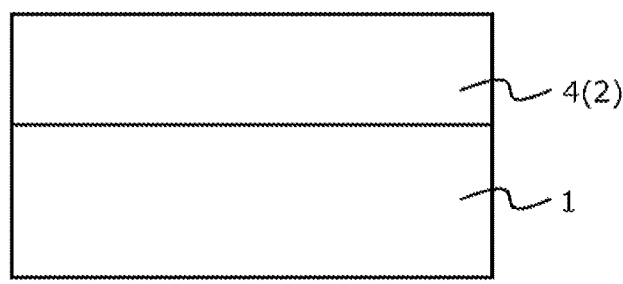
FIG. 3B is a cross-sectional view of another example of a semiconductor device during manufacture according to the first embodiment.

The method of manufacturing a semiconductor device according to a first embodiment will be described taking an example where a semiconductor device using a silicon carbide semiconductor substrate (silicon carbide substrate) is produced (manufactured). FIGS. 1, 2, and 3A are cross-sectional views of a semiconductor device during manufacture according to the first embodiment. FIG. 3B is a cross-sectional view of another example of a semiconductor device during manufacture according to the first embodiment. First, as depicted in FIG. 1, a predetermined device structure (not depicted) is formed in a silicon carbide substrate (silicon carbide wafer) 1 and subsequently a contact electrode 2 formed of a transition metal is formed in a surface of the silicon carbide substrate 1 by, for example, a sputtering method, a vapor deposition method, etc.

The transition metal configuring the contact electrode 2 is an element (metal) present within a range from the third element group to the eleventh element group in the periodic table of the elements. Preferably, the transition metal configuring the contact electrode 2 is a metal formed of nickel (Ni), titanium (Ti), molybdenum (Mo), tungsten (W), or silver (Ag); or alternatively is an alloy containing one or more of these metals as a primary component, i.e., the component that is greatest in content by mole fraction. The reason for this is that compared to other transition metals, nickel, titanium, molybdenum, tungsten, and silver have a low material cost and easily form an ohmic contact with the semiconductor portion and consequently, are of high practical use.

The transition metal layer configuring the contact electrode 2 is of a thickness that can ensure heat is generated to an extent that the interface of the transition metal layer and the silicon carbide substrate 1 can be sufficiently heated; and preferably, the surface of transition metal layer is near (thin) the interface with the silicon carbide substrate to an extent enabling heat transfer to the surroundings resulting from thermal radiation to be prevented, without an occurrence of heat dissipation or insufficient energy required for forming the ohmic contact. More specifically, the thickness of the transition metal layer is preferably, for example, 10 nm or greater and 200 nm or less, and more preferably, 20 nm or greater and 100 nm or less. Further, by configuring the transition metal layer to have a thickness that is, for example, 10 nm or greater and 200 nm or less, the contact electrode 2 can be caused to generate heat for a short period by plasma processing described hereinafter, enabling the entire contact electrode 2 to be converted to silicide to form the ohmic contact, without transferring heat to the surroundings.

Next, as depicted in FIG. 2, the entire silicon carbide substrate 1 (the entire device including components formed on the substrate) is exposed to a hydrogen plasma atmosphere (plasma processing). As a result, a surface layer of the side of the contact electrode 2 exposed to the hydrogen plasma atmosphere, or in a case where the thickness of the contact electrode 2 is thin, the entire contact electrode 2, adsorbs hydrogen atoms or hydrogen radicals (H·) 3 (hereinafter, collectively, the hydrogen atoms 3) in the hydrogen plasma atmosphere and is heated by the energy released when hydrogen molecules form. Here, although the entire device surface is exposed to (irradiated with) hydrogen plasma, the transition metal alone adsorbs the hydrogen atoms 3 and therefore, the transition metal layer alone receives the energy from the hydrogen atoms 3 to generate heat. Consequently, constituent portions other than the contact electrode 2 forming the device do not generate heat.

The heat generated by the contact electrode 2 from the bond energy released when the hydrogen atoms 3 form hydrogen molecules is conducted toward the silicon carbide substrate 1 side. As a result, the portion of the silicon carbide substrate 1 contacting the contact electrode 2 is heated and as depicted in FIG. 3A, a silicide layer 4 is formed at the interface of the silicon carbide substrate 1 and the contact electrode 2, to become an ohmic contact (electrical contact portion) of the silicon carbide substrate 1. Alternatively, as depicted in FIG. 3B, depending on the thickness of the contact electrode 2, the entire contact electrode 2 is converted to silicide to become the silicide layer 4. The raised temperature of the contact electrode 2 when caused to generate heat by the plasma processing is a temperature that enables formation of the ohmic contact of the silicon carbide substrate 1 and the contact electrode 2 and, for example, is 1000 degrees C. or greater.

When the entire contact electrode 2 is converted to silicide by the plasma processing, the generation of heat by the contact electrode 2 ends when the entire contact electrode 2 has reacted. In other words, the heating of the portion of the silicon carbide substrate 1 contacting the contact electrode 2 ends immediately after the reaction of converting the entire contact electrode 2 to silicide is completed. Therefore, the thickness of the transition metal layer configuring the contact electrode 2 is within the range described above, whereby the entire contact electrode 2 is converted to silicide in a short period and immediately after the entire contact electrode 2 is converted to silicide, the transfer of heat from the contact electrode 2 can be automatically stopped. The time consumed for the entire contact electrode 2 to be converted to silicide, i.e., the duration of the heating by a transfer of heat from the contact electrode 2 is, for example, several tens of seconds.

The hydrogen plasma used in the plasma processing above, for example, is microwave plasma generated by reducing the pressure of substantially 100% pure hydrogen ($H_2$) gas in a chamber to a predetermined pressure, and using collisional ionization of the gas molecules and electrons accelerated by the electric field of the microwaves. The microwaves, for example, are of a frequency band that can be used in the industry and are preferably 1 GHz or greater to enable high-density hydrogen plasma to be generated, and more preferably, microwaves of a frequency of 2.45 GHz are used. Further, to generate high-density hydrogen plasma, for example, the pressure of the hydrogen gas is preferably lowered to about 10 Pa or more and 100 Pa or less. Hereinafter, the hydrogen plasma atmosphere formed by microwaves will be simply referred to as hydrogen plasma atmosphere.

As a condition of the plasma processing above, the microwave electrical power is 500 W or more when generating the hydrogen plasma atmosphere and the entire silicon carbide wafer is preferably exposed to the hydrogen plasma atmosphere for a short period (plasma processing period) of about 400 seconds or less, for example. The reason for this is that when the plasma processing period is long, the heat generated by the contact electrode 2 during plasma processing is conducted throughout the silicon carbide substrate 1, heating the silicon carbide substrate 1. The temperature rise associated with the heat generated by the transition metal layer becomes highly dependent on the magnitude of the electrical power and the plasma density of the hydrogen plasma. Therefore, the electrical power and the plasma density of the hydrogen plasma suffices to be set such that the electrode that receives the energy released when the hydrogen atoms 3 adsorbed by the contact electrode 2 form molecules becomes a predetermined temperature within a short period of exposure to the hydrogen plasma atmosphere.

In the method of the present invention, since the bond energy when the hydrogen atoms form hydrogen molecules is released directly to the transition metal layer and the high density plasma is realized by microwaves, heating that is faster than conventional techniques becomes possible. Therefore, the method of the present invention is advantageous in that large agglomerations of the reaction product carbon do not form easily. Further, a portion of the carbon resulting from the reaction, particularly the carbon near the surface can be removed as a gas such as methane ($CH_4$) by reacting with hydrogen. Therefore, carbon deposition in the silicide layer formed by the method of the present invention is reduced affording the advantages lower contact resistivity and fewer adverse effects on the adhesiveness of the metal electrode layer at subsequent processes.

Figure 4:
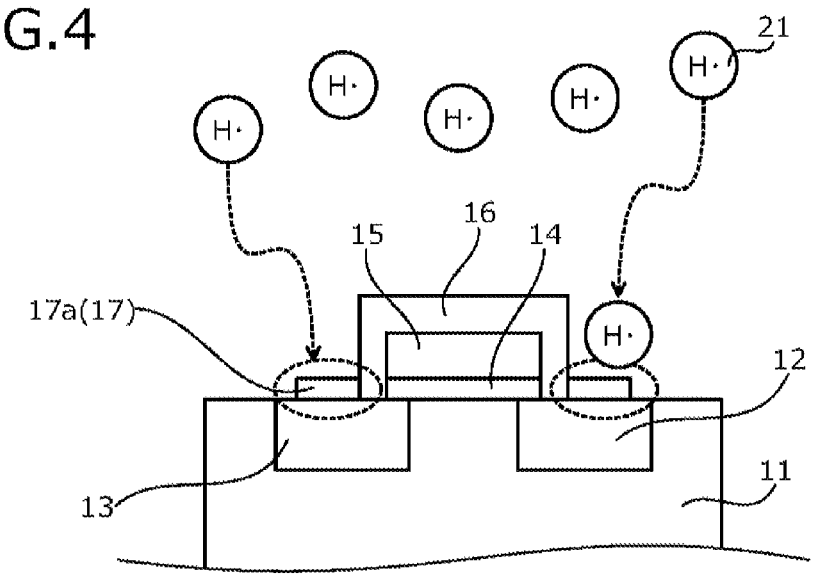
FIG. 4 is a cross-sectional view of a substrate front surface side of a semiconductor device during manufacture according to the first embodiment.

A method of manufacturing a metal oxide semiconductor field effect transistor (MOSFET) will be described as an example of application of the method of manufacturing a semiconductor device according to the first embodiment. FIG. 4 is a cross-sectional view of a substrate front surface side of a semiconductor device during manufacture according to the first embodiment. First, as depicted in FIG. 4, a MOS gate (insulated gate contacting an electrical conductor to the semiconductor substrate via an insulating film) structure formed by a source region 12, a drain region 13, a gate insulating film 14, and a gate electrode 15 is formed on front surface side of a silicon carbide substrate becoming a drift region 11 by a general method. Here, for example, the electrical conductor corresponds to the gate electrode 15, the insulating film corresponds to the gate insulating film 14, and the semiconductor substrate corresponds to a silicon carbide substrate on which the source region 12, the drain region 13, and the drift region 11 are disposed.

Next, in the front surface of the silicon carbide substrate, an interlayer insulating film 16 is formed. Next, for example, by photolithography and etching, the interlayer insulating film 16 is patterned, and a contact hole exposing the source region 12 and a contact hole exposing the drain region 13 are respectively formed. Next, by a sputtering method, a vapor deposition method, etc., inside the respective contact holes, for example, a nickel layer 17 contacting the source region 12 and a nickel layer 17 contacting the drain region 13 are formed. Next, the entire silicon carbide substrate (the entire device) on which the MOS gate structure and the nickel layer 17 are formed is exposed to a hydrogen plasma atmosphere.

By exposure to the hydrogen plasma atmosphere, the nickel layers 17 adsorb hydrogen atoms 21 in the hydrogen plasma atmosphere and are heated by the bond energy released when hydrogen molecules form. By a transfer of heat from the nickel layers 17, the source region 12 and the drain region 13 directly beneath the nickel layers 17 are heated. As a result, the nickel layers 17 are converted to silicide, forming nickel silicide layers 17a that become ohmic contacts with the silicon carbide semiconductor portion (portion encompassed by dotted ellipse). In FIG. 4, an example where the entire nickel layer 17 becomes the nickel silicide layer 17a is depicted (similarly, in FIGS. 5 to 11). Plasma processing conditions, for example, are as follows. Inside a chamber, substantially 100% pure hydrogen gas is introduced at a flowrate of 10 sccm and after the pressure is reduced to about 25 Pa, microwave energy of 1000 W is supplied, generating microwave plasma. The plasma processing period is 60 to 90 seconds.

Thereafter, in the substrate front surface, for example, an electrode pad (not depicted) formed of aluminum (Al) and contacting the nickel silicide layer 17a is formed so as to be embedded in the contact hole, thereby completing a front surface electrode. Thereafter, remaining device structures (not depicted) of the substrate front surface side such as a passivation film, and a back surface electrode of the substrate back surface side are formed, and cutting into chips (dicing) is performed, whereby the MOSFET is completed. Thus, the source region 12 and the drain region 13 directly beneath the nickel layer 17 are heated using the bond energy released when the hydrogen atoms 21 adsorbed by the nickel layer 17 (transition metal layer) form hydrogen molecules. Since materials other than the transition metal do not generate heat, even when exposed to the hydrogen plasma atmosphere, the gate insulating film 14 and the interlayer insulating film 16 formed of an oxide film ($SiO_2$) and the gate electrode 15 formed of polysilicon (poly-Si) are not excessively heated.

Figure 5:
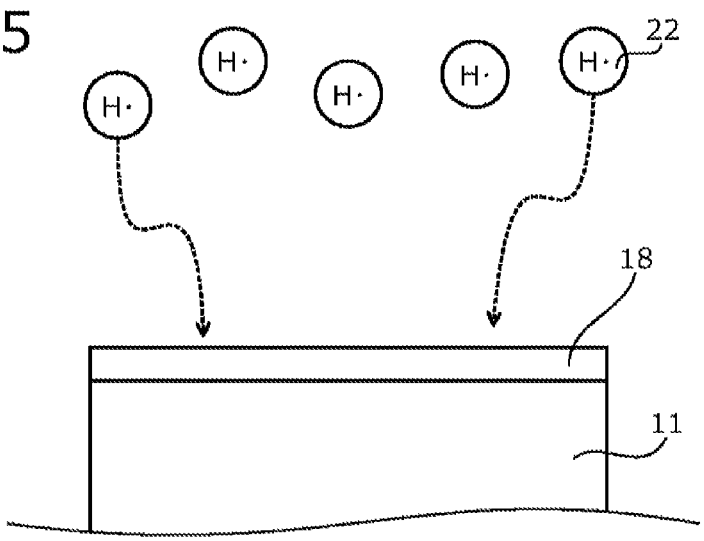
FIG. 5 is a cross-sectional view of a substrate back surface side of a semiconductor device during manufacture according to the first embodiment.
Figure 6:
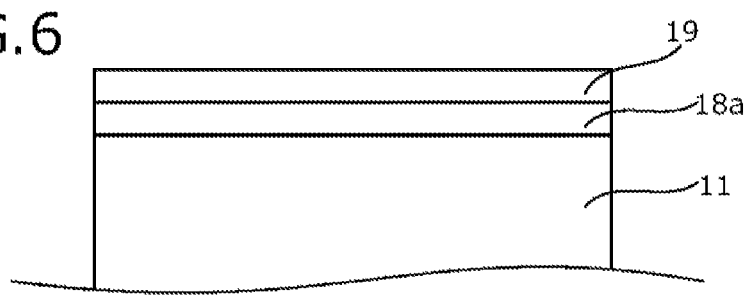
FIG. 6 is a cross-sectional view of the substrate back surface side of the semiconductor device during manufacture according to the first embodiment.

Further, even when an ohmic contact is formed in the back surface of the silicon carbide substrate, similar to when an ohmic contact is formed in the front surface, the transition metal layer alone generates heat, enabling formation of the ohmic contact. More specifically, the ohmic contact is formed in the back surface of the silicon carbide substrate as follows. FIGS. 5 and 6 are cross-sectional views of the substrate back surface side of a semiconductor device during manufacture according to the first embodiment. In FIGS. 5 and 6, the substrate back surface is depicted on the upper side and the device structure of the substrate front surface side is not depicted (similarly in FIGS. 7 to 9). First, as depicted in FIG. 5, a nickel layer 18 is formed in the back surface of the silicon carbide substrate, which becomes the drift region 11, by a sputtering method, a vapor deposition method, etc.

Next, the entire silicon carbide substrate (the entire device) having the nickel layer 18 formed thereon, is exposed to the hydrogen plasma atmosphere. As a result, only the nickel layer 18 formed of a transition metal adsorbs hydrogen atoms 22 in the hydrogen plasma atmosphere and is heated by the energy released when the hydrogen atoms 22 form hydrogen molecules. By a transfer of the heat from the nickel layer 18, the semiconductor portion (silicon carbide substrate) directly beneath the nickel layer 18 is heated. As a result, as depicted in FIG. 6, the nickel layer 18 is converted to silicide, forming a nickel silicide layer 18a that becomes an ohmic contact with the silicon carbide semiconductor portion (the drift region 11).

Here, even when the MOS gate structure and the interlayer insulating film are formed in the front surface of the silicon carbide substrate side, the MOS gate structure and the interlayer insulating film are configured by a material other than a transition metal and therefore, do not generate heat since the hydrogen atoms 22 do not form hydrogen molecules. Further, the heat generated by the nickel layer 18 rises to a temperature that enables formation of the ohmic contact in a short period, enabling rapid heating; and the heat generated by the nickel layer 18 of the substrate back surface side is not conducted to the substrate front surface side. Therefore, constituent portions of the substrate front surface side can be prevented from being heated. Plasma processing conditions for forming the nickel silicide layer 18a may be the same as those of the plasma processing for forming an ohmic contact in the substrate front surface.

Next, for example, by a vapor deposition method, a titanium layer, a nickel layer, and a gold (Au) layer are sequentially stacked to form a stacked metal layer 19 in a surface of the nickel silicide layer 18a to thereby complete the back surface electrode. Since the ohmic contact (the nickel silicide layer 18a) is formed before the stacked metal layer 19 is formed, heat treatment (annealing) for the stacked metal layer 19 can be performed at low temperature whereby other constituent portions are not adversely affected by the heat treatment. Further, although description has been given taking an example where nickel is used as the material of the electrode to be converted to silicide, even for a transition metal other than nickel, similarly, the transition metal layer alone can be caused to generate heat to form an ohmic contact. Here, a different metal film can be inserted at the interface of the nickel layer and the silicon carbide substrate, to alloy multiple metals by the hydrogen plasma processing.

As described above, according to the first embodiment, the entire silicon carbide substrate (the entire device) on which the transition metal layer is formed in a surface, is exposed to the hydrogen plasma atmosphere, whereby hydrogen atoms in the hydrogen plasma atmosphere are adsorbed by the transition metal layer and only the transition metal is heated by the energy released when hydrogen molecules form; and by a transfer of the heat from the transition metal layer, the portion of the silicon carbide substrate contacting the transition metal layer is heated. As a result, the transition metal layer can be converted to silicide and a silicide layer of low contact resistivity can be formed to become an ohmic contact. Further, according to the first embodiment, when the entire device is exposed to the hydrogen plasma atmosphere, constituent portions other than the transition metal layer do not generate heat, for example, heat is not excessively applied near the gate insulating film of the MOS gate structure. Therefore, interface property characteristics of the gate insulating film and the silicon carbide semiconductor portion, and device characteristics can be prevented from degrading.

According to the first embodiment, since the ohmic contact is formed using the hydrogen atoms that are adsorbed by the transition metal layer, irrespective of patterns and unevenness of the device surface, only portions of the transition metal layer exposed to the wafer surface can be selectively and collectively heated. Therefore, throughput can be improved. According to the first embodiment, since the transition metal layer alone can be caused to generate heat and be heated with favorable control, contact resistivity deviations, unintended heating of constituent portions (e.g., gate insulating film, etc.), and degradation of device properties can be suppressed without needing complicated programing such as for laser annealing. Further, the minimum area that can be heated is a limiting factor for patterning techniques of transition metal layers by photolithography. Therefore, according to the first embodiment, even when the surface area of the transition metal layer is smaller than the area corresponding to the spot diameter of the laser, the transition metal layer alone can be heated.

(Second Embodiment)

Figure 7:
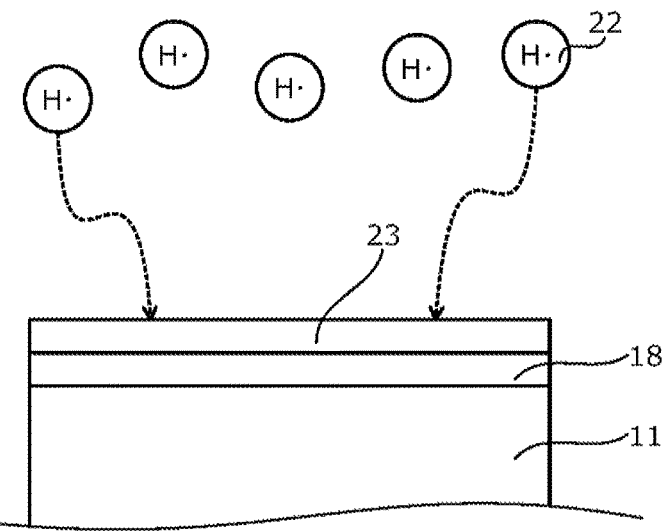
FIG. 7 is a cross-sectional view of a substrate back surface side of a semiconductor device during manufacture according to a second embodiment.
Figure 8:
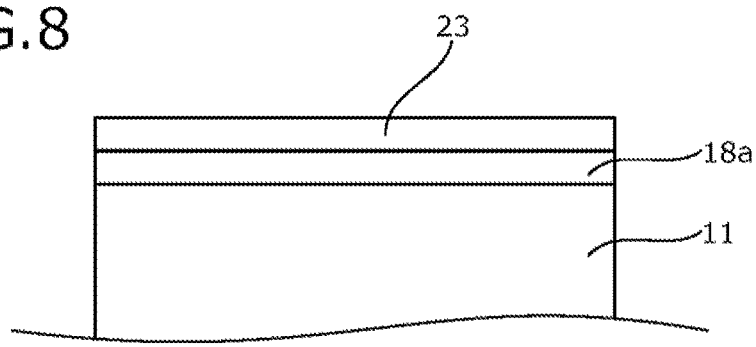
FIG. 8 is a cross-sectional view of the substrate back surface side of the semiconductor device during manufacture according to the second embodiment.
Figure 9:
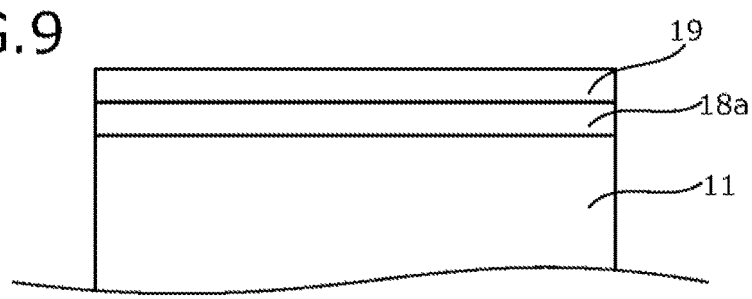
FIG. 9 is a cross-sectional view of the substrate back surface side of the semiconductor device during manufacture according to the second embodiment.

The method of manufacturing a semiconductor device according to a second embodiment will be described taking an example where an ohmic contact is formed in the back surface of a silicon carbide substrate. FIGS. 7, 8, and 9 are cross-sectional views of the substrate back surface side of a semiconductor device during manufacture according to the second embodiment. The method of manufacturing a semiconductor device according to the second embodiment differs from the method of manufacturing a semiconductor device according to the first embodiment in that after a titanium layer 23 is formed on a transition metal layer (e.g., the nickel layer 18) that is to be converted to silicide, the entire silicon carbide substrate (the entire device) is exposed to the hydrogen plasma atmosphere. The titanium layer 23 has a function of preventing the nickel silicide layer 18a formed by a reaction of the nickel layer 18 and a silicon carbide semiconductor portion (the drift region 11) from being adversely affected by carbon (C) in the silicon carbide semiconductor portion.

More specifically, as depicted in FIG. 7, similar to the first embodiment, the nickel layer 18 is formed in the back surface of the silicon carbide substrate. Next, the titanium layer 23 is formed on the nickel layer 18 so as to cover the entire surface of the nickel layer 18. Next, the entire silicon carbide substrate on which the nickel layer 18 and the titanium layer 23 are sequentially stacked is exposed to the hydrogen plasma atmosphere. Consequent to the exposure to the hydrogen plasma atmosphere, the hydrogen atoms 22 in the hydrogen plasma atmosphere are adsorbed by the titanium layer 23 (the uppermost surface layer) and the titanium layer 23 alone is heated by the formation of hydrogen molecules. Further, directly beneath the titanium layer 23, the nickel layer 18 and a portion of the silicon carbide substrate contacting the nickel layer 18 are heated by a transfer of the heat from the titanium layer 23. Since the entire surface of the nickel layer 18 is covered by the titanium layer 23, the heat generated by the titanium layer 23 is evenly transferred, providing uniform heating. As a result, as depicted in FIG. 8, the nickel layer 18 is converted to silicide to form the nickel silicide layer 18a.

The titanium layer 23 is of a thickness that is thinner than a thickness of the nickel layer 18 and, for example, may be 10 nm or greater and 100 nm or less. Preferably, the thickness of the titanium layer 23 is 30 nm or greater. The reason for this is that during exposure to the hydrogen plasma atmosphere, an effect of shielding the nickel layer 18 from hydrogen atoms can be increased. With the shielding of the hydrogen atoms by the titanium layer 23, the hydrogen atoms are not adsorbed by the nickel layer 18, enabling the nickel layer 18 to be uniformly heated by the transfer of the heat generated by the titanium layer 23 that covers the entire surface of the nickel layer 18.

Further, the nickel layer 18 agglomerates or vaporizes consequent to melting from heating and therefore, when silicidized to become the nickel silicide layer 18a, cracks, intermittent voids, etc. may occur. On the other hand, the titanium layer 23 having a melting point that is higher than that of the nickel layer 18 remains without melting and functions as a cap layer covering the entire surface of the nickel layer 18. Therefore, by covering the surface of the nickel layer 18 by the titanium layer 23, cracks, intermittent voids, etc. can be prevented from occurring in the nickel silicide layer 18a. In other words, by covering the surface of the nickel layer 18 by the titanium layer 23, the nickel layer 18 is uniformly heated and agglomeration and vaporization of the nickel layer 18 can be controlled. In cases where in place of the titanium layer 23, a tungsten layer or a molybdenum layer is formed, the effect of a cap layer can be similarly obtained. A configuration using a tungsten layer as a cap layer will be described in a sixth embodiment hereinafter.

Further, when the nickel silicide layer 18a is formed, excess carbon atoms that result from silicon atoms inside the silicon carbide semiconductor portion bonding with the nickel layer 18 bond with the titanium atoms inside the titanium layer 23. Therefore, deposition and agglomeration of carbon inside the nickel silicide layer 18a can be prevented. After the plasma processing, the titanium layer 23 may not be in a favorable state as an electrode layer and may cause peeling and degradation of electrical properties of the back surface electrode. Therefore, after the plasma processing, the titanium layer 23 is removed. As depicted in FIG. 9, similar to the first embodiment, in the surface of the nickel silicide layer 18a, the metal stacked film 19 of a titanium layer, a nickel layer, and a gold (Au) layer sequentially stacked is formed, whereby the back surface electrode is completed.

In the method of manufacturing a semiconductor device according to the second embodiment, a principal surface of the silicon carbide substrate in which the ohmic contact is formed, for example, may be a (000-1)C face of four layer periodic hexagonal (4H—SiC) silicon carbide, or may be a (0001)Si face. Compared to crystal faces having other plane orientations, carbon accumulates easily in the (000-1)C face and therefore, the ohmic contact (the nickel silicide layer 18a) formed in the (000-1)C face is more susceptible to the adverse effects of carbon. Consequently, an effect of suppressing the adverse effects of carbon atoms inside the silicon carbide substrate appears most strikingly in the case of formation of the nickel silicide layer 18a in the (000-1)C face.

Further, the titanium layer 23 alone may be formed in the back surface of the silicon carbide substrate, without forming the nickel layer 18. In this case, the hydrogen atoms 22 in the hydrogen plasma atmosphere are adsorbed by the titanium layer 23, the titanium layer 23 alone generates heat, and a titanium silicide layer is formed that becomes the ohmic contact with the silicon carbide substrate. Since titanium also reacts with carbon, when a titanium layer is used, the agglomeration of excess carbon atoms is curbed, enabling the adverse effects of excess carbon atoms to be suppressed to a greater extent than when the nickel silicide layer 18a, which is formed from the nickel layer 18, is formed. On the other hand, the nickel silicide layer 18a formed from the nickel layer 18 can reduce the contact resistivity to a greater extent than the titanium silicide layer formed from the titanium layer 23. Therefore, the transition metal layer that is to form the silicide layer is preferably selected according to design conditions.

As described, according to the second embodiment, effects identical to those of the first embodiment can be obtained.

(Third Embodiment)

Figure 10:
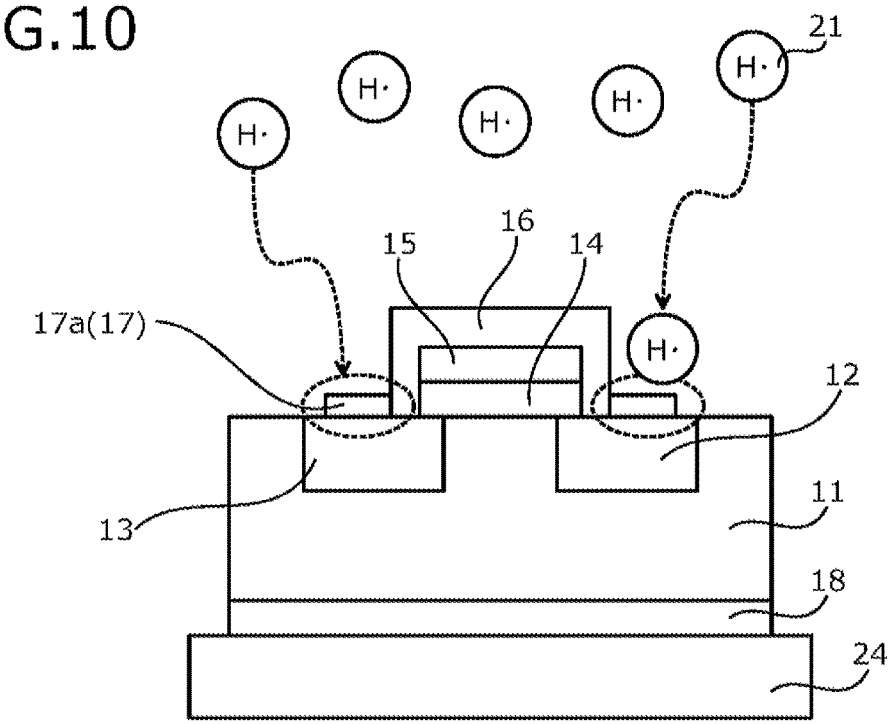
FIG. 10 is a cross-sectional view of a semiconductor device during manufacture according to a third embodiment.

The method of manufacturing a semiconductor device according to a third embodiment will be described taking as an example, a case where a MOSFET is formed. FIG. 10 is a cross-sectional view of a semiconductor device during manufacture according to the third embodiment. The method of manufacturing a semiconductor device according to the third embodiment differs from the method of manufacturing a semiconductor device according to the first embodiment in that with the nickel layers 17, 18 formed on both surfaces of the silicon carbide substrate, a quartz substrate 24 is disposed so as to contact the entire surface of the nickel layer 18 of the substrate back surface side and the entire silicon carbide substrate (the entire device) is exposed to the hydrogen plasma atmosphere.

More specifically, as depicted in FIG. 10, similar to the first embodiment, processes up to and including those of forming the nickel layers 17, 18 in the surfaces of the silicon carbide substrate respectively are performed. Next, the quartz substrate 24 is disposed so as to contact the entire surface of the nickel layer 18 of the substrate back surface side. Next, with the quartz substrate 24 disposed so as to contact the entire surface of the nickel layer 18, the entire silicon carbide substrate is exposed to the hydrogen plasma atmosphere. Since the nickel layer 18 is shielded from hydrogen atoms 21 by the quartz substrate 24 and thus, the hydrogen atoms 21 do not reach the nickel layer 18 of the substrate back surface side, the nickel layer 18 of the substrate back surface side does not generate heat.

On the other hand, the nickel layer 17 of the substrate front surface side is exposed to the hydrogen plasma atmosphere and therefore, adsorbs the hydrogen atoms 21 in the hydrogen plasma atmosphere and is heated by the heat generated from the bond energy released when hydrogen molecules are formed. Therefore, for example, in a case where the back surface electrode is already completed in the processes up to the plasma processing for forming the ohmic contact in the substrate front surface side, the nickel layer 17 of the substrate front surface side alone can be caused to generate heat and be heated, without the nickel layer 18 of the substrate back surface side being affected by the hydrogen atoms 21.

In other words, by this plasma processing, the nickel silicide layer 17a alone is formed in the substrate front surface side. Thereafter, similar to the first embodiment, an electrode pad (not depicted) of aluminum, etc. is formed, completing the front surface electrode. In place of the quartz substrate 24, a silicon substrate or a metal substrate that is formed by a metal other than a transition metal and that does not generate heat consequent to the hydrogen atoms 21 may be used. Preferably, the quartz substrate 24 is used from the viewpoint of preventing foreign particles from adhering to the nickel layer 18.

As described, according to the third embodiment, effects identical to those of the first embodiment can be obtained.
(Fourth Embodiment)

Figure 11:
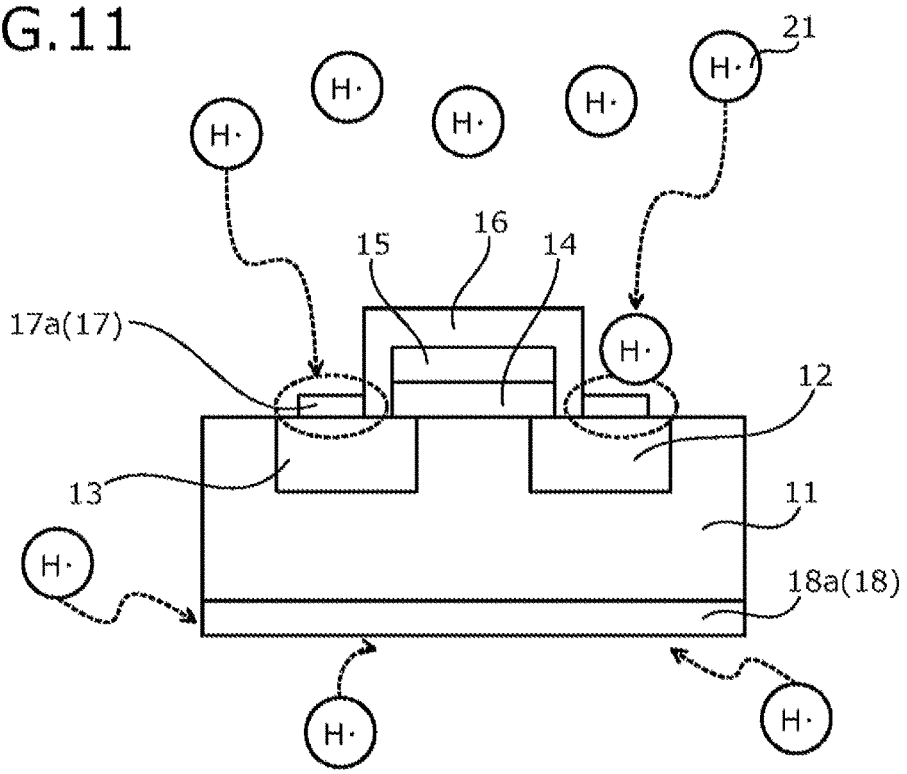
FIG. 11 is a cross-sectional view of a semiconductor device during manufacture according to a fourth embodiment.

The method of manufacturing a semiconductor device according to a fourth embodiment will be described taking as an example, a case where a MOSFET is formed. FIG. 11 is a cross-sectional view of a semiconductor device during manufacture according to the fourth embodiment. The method of manufacturing a semiconductor device according to the fourth embodiment differs from the method of manufacturing a semiconductor device according to the third embodiment in that the nickel layers 17, 18 formed on both sides of silicon carbide substrate are simultaneously exposed to the hydrogen plasma atmosphere. On other words, the nickel layer 18 of the substrate back surface side is not covered by a quartz substrate.

More specifically, for example, with the nickel layers 17, 18 formed, the silicon carbide wafer is housed in a wafer cassette (not depicted) equipped with slits and is exposed to the hydrogen plasma atmosphere. The nickel layers 17, 18 formed in both substrate surfaces are simultaneously exposed to the hydrogen plasma atmosphere, whereby both of the nickel layers 17, 18 can be simultaneously caused to generate heat and be heated, enabling the nickel silicide layers 17a, 18a to be formed on the surfaces of the substrate. Since plasma processing for the ohmic contacts on both substrate sides can be performed by a single process, the manufacturing processes can be simplified.

As described, according to the fourth embodiment, effects identical to those of the first embodiment can be obtained.
(Fifth Embodiment)

Figure 12:
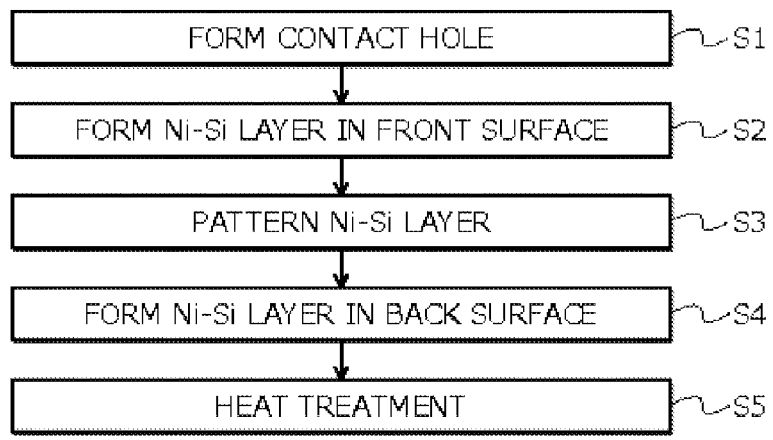
FIG. 12 is a flowchart outlining the method of manufacturing a semiconductor device according to a fifth embodiment.

The method of manufacturing a semiconductor device according to a fifth embodiment will be described. FIG. 12 is a flowchart outlining the method of manufacturing a semiconductor device according to the fifth embodiment. FIGS. 13, 14, 15, 16, and 17 are cross-sectional views of a semiconductor device during manufacture according to the fifth embodiment. The method of manufacturing a semiconductor device according to the fifth embodiment differs from the method of manufacturing a semiconductor device according to the first embodiment in that a transition metal layer that includes silicon is formed as the transition metal layer formed on the silicon carbide substrate to form ohmic contact. Here, an example will be described where, for example, a nickel layer (hereinafter, nickel-silicon (Ni—Si) layer) 34 that includes silicon is formed as the transition metal layer that includes silicon.

Figure 13:
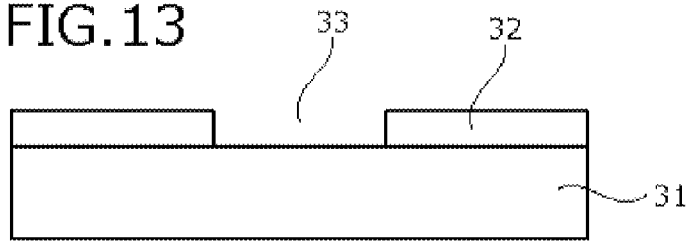
FIG. 13 is a cross-sectional view of a semiconductor device during manufacture according to the fifth embodiment.
Figure 14:
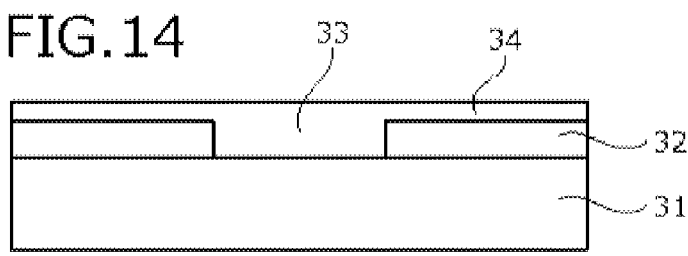
FIG. 14 is a cross-sectional view of the semiconductor device during manufacture according to the fifth embodiment.

More specifically, as depicted in FIG. 13, an interlayer insulating film 32 is formed in a front surface of a silicon carbide substrate 31. Next, a contact hole 33 is formed that in a direction of depth, penetrates the interlayer insulating film 32 and reaches the silicon carbide substrate 31 (step S1). Next, as depicted in FIG. 14, a nickel-silicon layer 34 is formed in the front surface of the silicon carbide substrate 31 by a sputtering method, a vapor deposition method, etc. so as to be embedded in the contact hole 33 (step S2). The nickel-silicon layer 34, for example, suffices to include silicon at a rate of 10% or more and 60% or less. The reason for this is that adverse effects consequent to the carbon atoms in the silicon carbide substrate can be suppressed as described hereinafter. The content rate of silicon in the nickel-silicon layer 34, for example, varies according to plasma processing conditions, the state of the silicon carbide substrate 31 (e.g., impurity concentration), etc. Further, the nickel-silicon layer 34 need not be an alloy and may be a layered structure of a nickel film and a silicon film.

Figure 15:
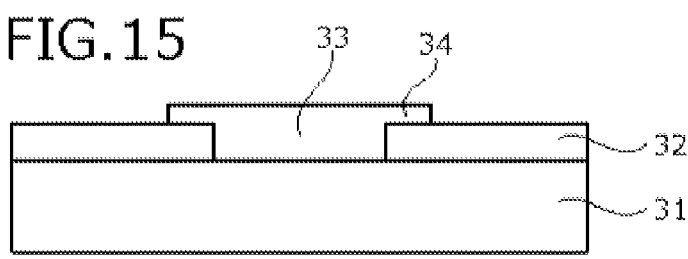
FIG. 15 is a cross-sectional view of the semiconductor device during manufacture according to the fifth embodiment.
Figure 16:
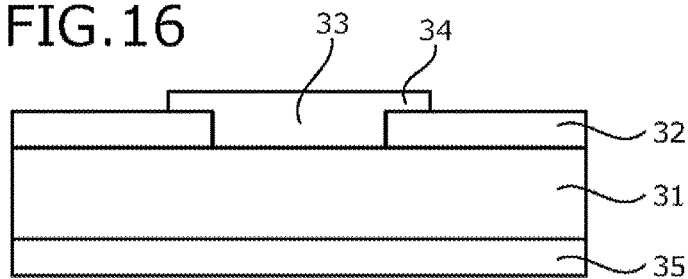
FIG. 16 is a cross-sectional view of the semiconductor device during manufacture according to the fifth embodiment.
Figure 17:
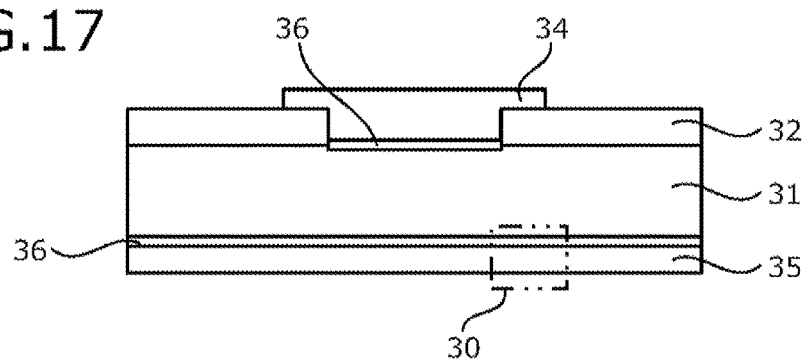
FIG. 17 is a cross-sectional view of the semiconductor device during manufacture according to the fifth embodiment.

Next, as depicted in FIG. 15, by photolithography and etching, the nickel-silicon layer 34 is patterned and the nickel-silicon layer 34 is left inside the contact hole 33 (step S3). Next, as depicted in FIG. 16, a nickel-silicon layer 35 is formed in the back surface of the silicon carbide substrate 31 by a sputtering method, a vapor deposition method, etc. (step S4). Next, as depicted in FIG. 17, for example, the entire silicon carbide substrate 31 (the entire device) on which the nickel-silicon layers 34, 35 are formed on the respective sides is exposed to the hydrogen plasma atmosphere and the plasma processing is performed similarly to the first embodiment (heat treatment).

By the exposure to the hydrogen plasma atmosphere, the nickel-silicon layers 34, 35 alone adsorb the hydrogen atoms (not depicted) in the hydrogen plasma atmosphere and become heated by the bond energy released when hydrogen molecules form. Further, by a transfer of the heat from the nickel-silicon layers 34, 35, portions of the silicon carbide substrate 31 directly beneath the nickel-silicon layers 34, 35 are heated. As a result, the nickel-silicon layers 34, 35 are converted to silicide to form silicide layers 36 that become ohmic contacts with the silicon carbide semiconductor portion (step S5).

At steps S2, S4, in place of the nickel-silicon layers 34, 35, another transition metal (e.g., titanium, tungsten, molybdenum (Mo), cobalt (Co), etc. that can be converted to silicide) layer that includes silicon may be formed. Further, the patterning of the nickel-silicon layer 34 at step S3 may be performed after the heat treatment at step S5. The heat treatment at step S5 preferably is performed under conditions that do not diffuse the silicon inside the silicon carbide substrate 31 into the nickel-silicon layers 34, 35. Further, the heat treatment at step S5, for example, when the third embodiment is applied, may be performed for a single side at a time, and when the fourth embodiment is applied, may be performed for both sides simultaneously.

In the heat treatment at step S5, conversion of the nickel-silicon layers 34, 35 to silicide progresses to form the silicide layers 36 having a predetermined contact resistivity and even in cases where other heat treatment is performed such as conventional furnace annealing, laser annealing, lamp annealing, induction heating, etc., the same effects can be obtained. When heat treatment by a conventional method is performed, for example, a pure metal (magnetic material) may be disposed on the nickel-silicon layers 34, 35 as a heat generator during induction heating from an external source.

Figure 18:
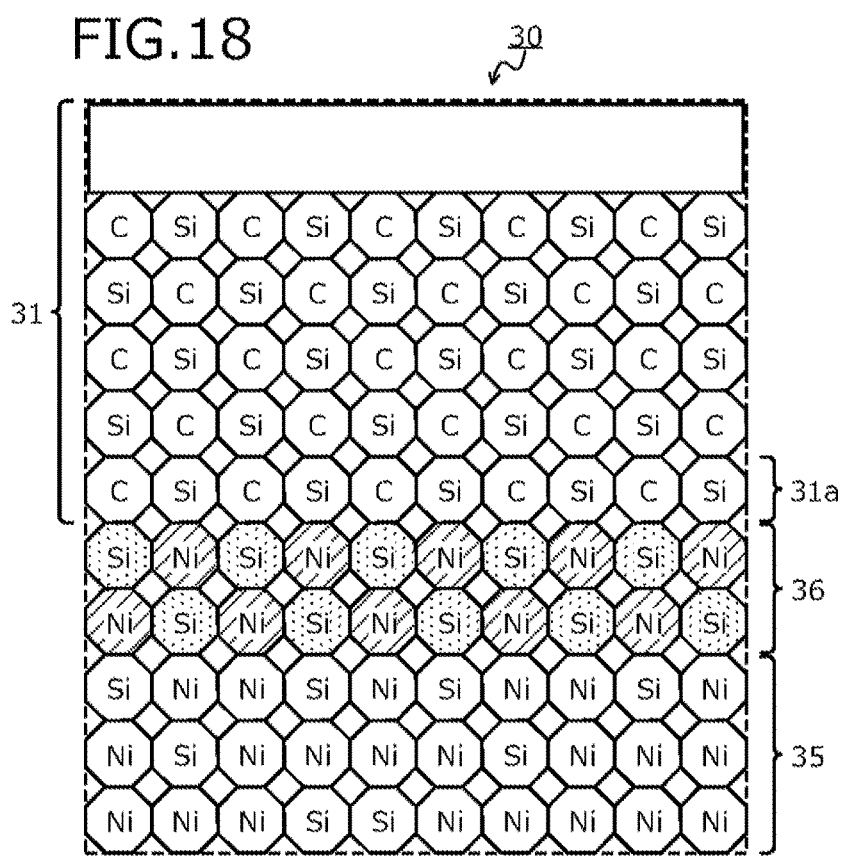
FIG. 18 is a cross-sectional schematic view of a crystalline structure near an ohmic contact of a semiconductor device manufactured according to the method of manufacturing a semiconductor device of the fifth embodiment.
Figure 19:
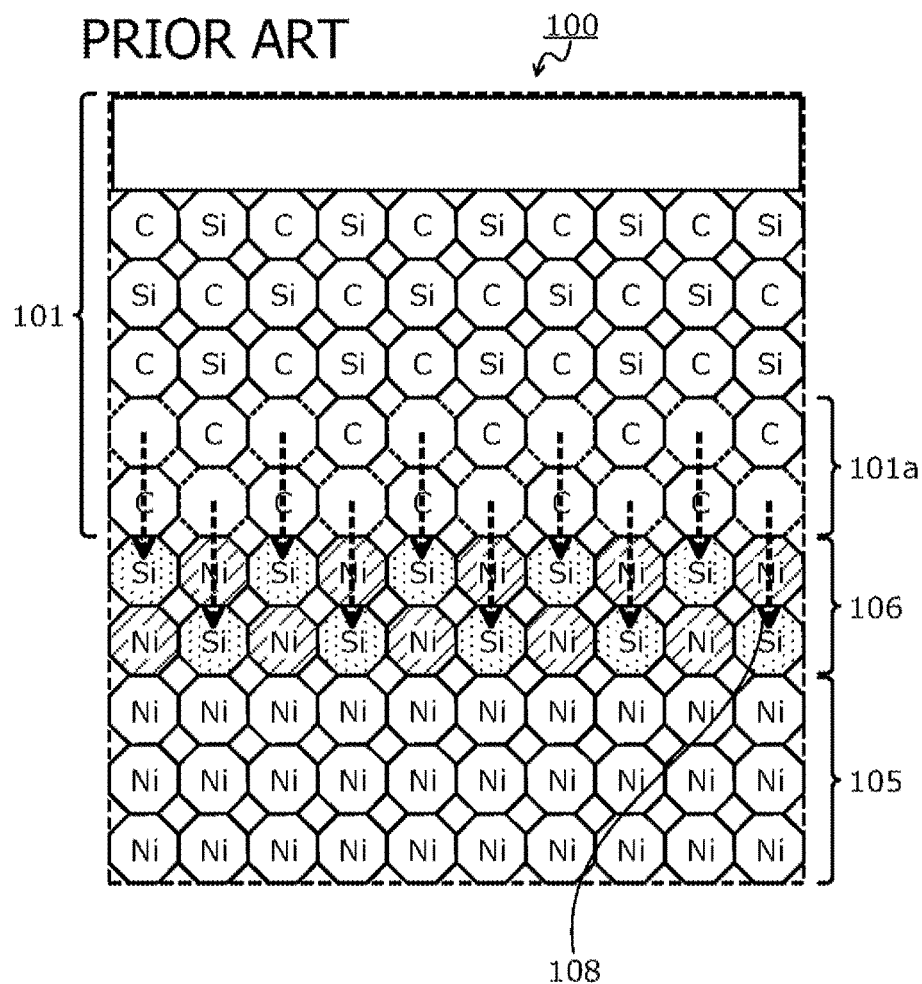
FIG. 19 is a cross-sectional schematic view of a crystalline structure near an ohmic contact of a semiconductor device manufactured by a conventional method of manufacturing a semiconductor device.

The crystalline structure near the ohmic contact (the silicide layers 36) of a semiconductor device manufactured according to the method of manufacturing a semiconductor device of the fifth embodiment will be described. FIG. 18 is a cross-sectional schematic view of the crystalline structure near an ohmic contact of a semiconductor device manufactured according to the method of manufacturing a semiconductor device of the fifth embodiment. FIG. 19 is a cross-sectional schematic view of the crystalline structure near an ohmic contact of a semiconductor device manufactured by a conventional method of manufacturing a semiconductor device. Although FIG. 18 depicts the crystalline structure of an ohmic contact (the silicide layer 36 formed from the nickel-silicon layer 35) vicinity 30 of the substrate back surface side of a semiconductor device according to the fifth embodiment, the ohmic contact (the silicide layer 36 formed from the nickel-silicon layer 34) of the substrate front surface side also has the same crystalline structure. Hereinafter, description will be given taking the crystalline structure of the ohmic contact vicinity 30 of the substrate back surface side as an example. FIG. 19 depicts the crystalline structure of an ohmic contact vicinity 100 of the substrate back surface side of a semiconductor device manufactured by the conventional method of manufacturing a semiconductor device depicted in FIGS. 23 to 28, described above. For the conventional semiconductor device as well, description will be given taking the crystalline structure of the ohmic contact vicinity 100 of the substrate back surface side depicted in FIG. 19 as an example.

As depicted in FIG. 19, in the conventional semiconductor device, a substantially 100% pure transition metal layer (substantially 100% pure nickel layer (pure nickel layer) 105) is formed. Therefore, by the heat treatment, silicon atoms in the silicon carbide substrate 101 diffuse 108 into the pure nickel layer 105, and these silicide atoms and the nickel atoms inside the pure nickel layer 105 react to form the silicide layer 106. As a result, in the silicide layer 106 side of the silicon carbide substrate 101, a layer (hereinafter, carbon-rich layer) 101a of a higher carbon content than other portions in the silicon carbide substrate 101 is formed. When the carbon-rich layer 101a is formed in this manner, the carbon-rich layer 101a is a source of cracks in the silicide layer 106 and the silicide layer 106 may peel. Further, the resistivity of carbon is hundreds of times higher than that of nickel and therefore, a problem arises in that the contact resistivity becomes high. In addition, when the silicide layer 106 is formed, with the diffusion 108 of the silicon atoms inside the silicon carbide substrate 101, heat treatment for a long period at a high temperature that breaks the Si—C bonds of the carbon atoms and the silicon atoms in the silicon carbide substrate 101 is necessary. Therefore, power consumption is much greater in the manufacturing processes of a silicon carbide semiconductor device as compared to manufacturing processes for a silicon semiconductor device. An advantage of a silicon carbide semiconductor device as a product is lower power consumption than a silicon semiconductor device. Therefore, the conventional method of manufacturing a silicon carbide semiconductor device has a tradeoff with the advantage of a silicon carbide semiconductor device as a product.

In contrast, as depicted in FIG. 18, in the semiconductor device according to the fifth embodiment, since silicon atoms are included inside the nickel-silicon layer 35, diffusion of silicon atoms from the silicon carbide substrate 31 to the nickel-silicon layer 35 is suppressed, and the nickel atoms inside the nickel-silicon layer 35 react with substantially all silicon atoms inside the nickel-silicon layer 35 to form the silicide layer 36. By suppressing the diffusion of the silicon atoms from the silicon carbide substrate 31, there is substantially no formation of the carbon-rich layer in a portion 31a of the silicide layer 36 side of the silicon carbide substrate 31. Therefore, peeling of the silicide layer 36 can be suppressed. Further, the contact resistivity can be prevented from becoming high. In addition, since the nickel-silicon layer 35 is entirely an alloy, the silicide layer 36 can be formed by plasma processing for a shorter period and at a lower temperature than by the convention method. Therefore, power consumption during manufacturing can be reduced.

As described, according to the fifth embodiment, effects identical to those of the first embodiment can be obtained.
(Sixth Embodiment)

Figure 20:
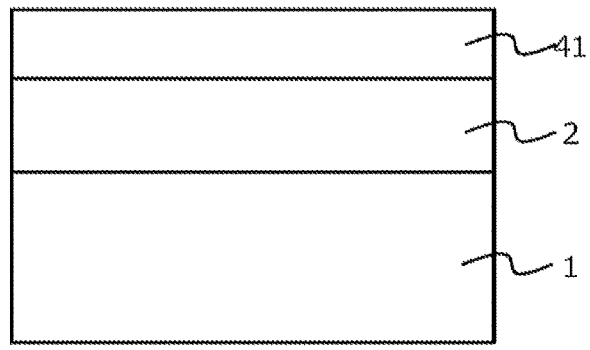
FIG. 20 is a cross-sectional view of a semiconductor device manufactured according to a sixth embodiment.
Figure 21:
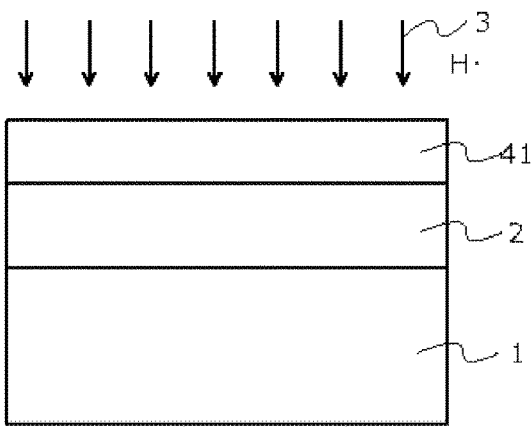
FIG. 21 is a cross-sectional view of the semiconductor device manufactured according to the sixth embodiment.
Figure 22:
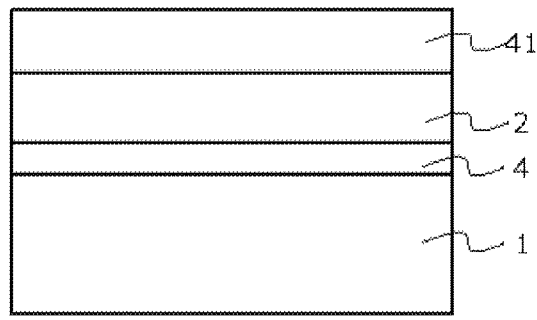
FIG. 22 is a cross-sectional view of the semiconductor device manufactured according to the sixth embodiment.
Figure 23:
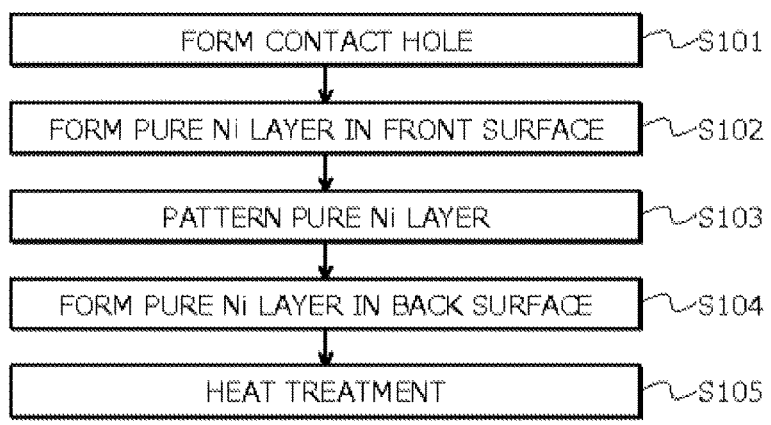
FIG. 23 is a flowchart outlining a conventional method of manufacturing a semiconductor device.
Figure 24:
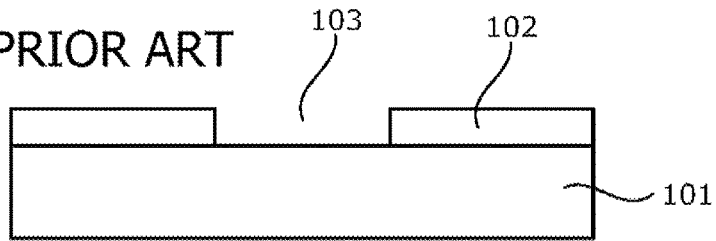
FIG. 24 is a cross-sectional view of a conventional semiconductor device during manufacture.
Figure 25:
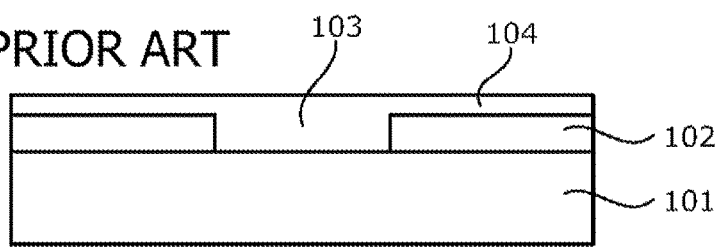
FIG. 25 is a cross-sectional view of the conventional semiconductor device during manufacture.
Figure 26:
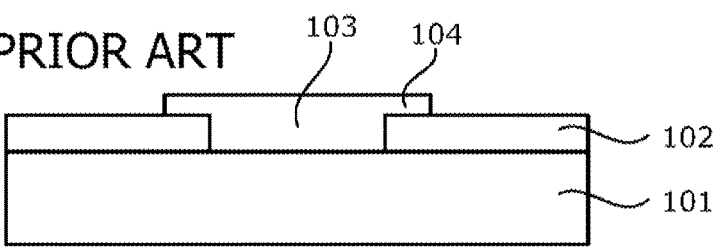
FIG. 26 is a cross-sectional view of the conventional semiconductor device during manufacture.
Figure 27:
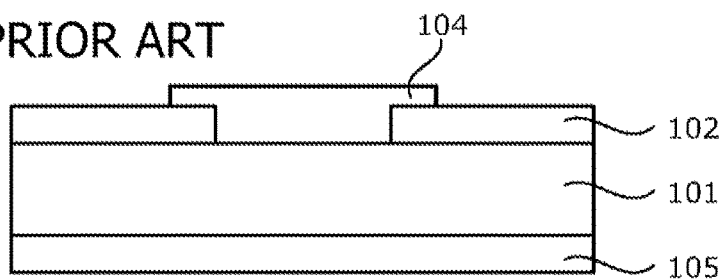
FIG. 27 is a cross-sectional view of the conventional semiconductor device during manufacture.
Figure 28:
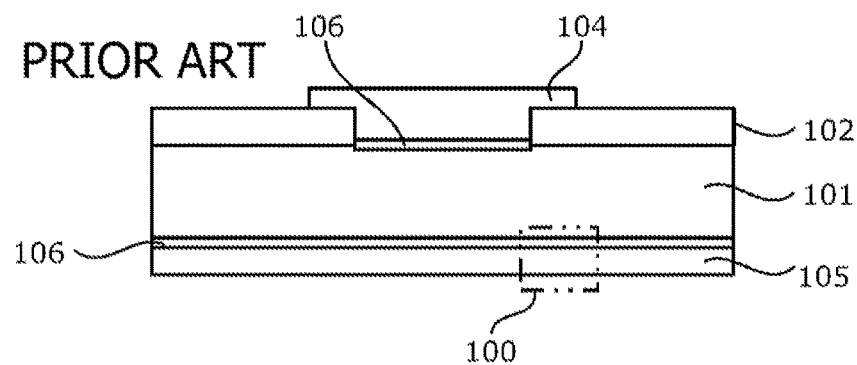
FIG. 28 is a cross-sectional view of the conventional semiconductor device during manufacture.

The method of manufacturing a semiconductor device according to the sixth embodiment will be described. FIGS. 20, 21, and 22 are cross-sectional views of a semiconductor device manufactured according to the sixth embodiment. The method of manufacturing a semiconductor device according to the sixth embodiment differs from the method of manufacturing a semiconductor device according to the first embodiment in that after a transition metal layer (a tungsten layer 41) of a higher melting point than the contact electrode 2 is formed on the transition metal layer (e.g., the contact electrode 2 formed from nickel) that is to be converted into silicide, the entire silicon carbide substrate (the entire device) is exposed to the hydrogen plasma atmosphere. The tungsten layer 41 has a function as a heat source of the contact electrode 2 and functions to uniformly heat a metal layer that becomes the silicide layer 4, and further functions to serve as a cap layer for preventing agglomeration and vaporization of the silicide layer 4.

More specifically, as depicted in FIG. 20, similar to the first embodiment, a process of forming the contact electrode 2 of a transition metal in the surface of the silicon carbide substrate 1 is performed. Next, the tungsten layer 41 is formed on the contact electrode 2 to contact the entire surface of the contact electrode 2. Next, as depicted in FIG. 21, the entire silicon carbide substrate on which the contact electrode 2 and the tungsten layer 41 are sequentially stacked is exposed to the hydrogen plasma atmosphere. Since the tungsten layer 41 is formed of a transition metal, the tungsten layer 41 adsorbs hydrogen atoms in the hydrogen plasma atmosphere and the tungsten layer 41 is heated by the bond energy released when hydrogen molecules form.

The contact electrode 2, having a higher vapor pressure than the tungsten layer 41, is susceptible to vaporization by the heating in the hydrogen plasma atmosphere. However, the entire surface of the contact electrode 2 is covered by the tungsten layer 41 that has not melted and therefore, as described above, agglomeration and vaporization of the contact electrode 2 can be suppressed by the tungsten layer 41. Therefore, as depicted in FIG. 22, the portion of the contact electrode 2 becoming the silicide layer 4 is evenly heated and without the occurrence of agglomeration or vaporization of the silicide layer 4, the silicide layer 4 is formed evenly at the interface of the silicon carbide substrate 1 and the contact electrode 2.

Thereafter, the tungsten layer 41 is preferably removed. The reason for this is that tungsten has a higher resistivity than nickel, making the contact resistivity higher. Further, when the tungsten layer 41 is formed as a cap layer, the tungsten layer 41 generates heat and therefore, the metal material used for the contact electrode 2 is not limited to a transition metal and, for example, may be aluminum or an aluminum alloy.

As described, according to the sixth embodiment, effects identical to those of the first and the second embodiments can be obtained.

The present invention is not limited to the above embodiments and various changes can be made thereto within a scope that does not depart from the spirit of the present invention. Further, in the embodiments above, although description is given using a silicon carbide substrate as an example, identical effects are achieved for a semiconductor substrate (silicon substrate) that uses silicon. In the case of a silicon substrate, the temperature of the heat generated when hydrogen atoms form hydrogen molecules is set based on the state of silicon substrate, the melting point of the transition metal layer, etc. Further, in the embodiments, although description is given using a semiconductor device having a MOS gate structure, the method is not limited hereto and for example, is applicable to a semiconductor device having a device structure in which film is used as a substrate such as an insulating film or semiconductor portion of which device properties are possibly changed due to heating.

According to the invention, the transition metal layer alone generates heat and is heated, whereby a transfer of heat from the transition metal layer, heats a portion of the silicon carbide substrate contacting the transition metal layer. As a result, a metal silicide layer that becomes an ohmic contact with the silicon carbide substrate can be formed. Further, since constituent portions other than the transition metal layer do not generate heat, for example, heat is not applied near the gate insulating film of the MOS gate structure. Therefore, degradation of interface properties of the gate insulating film and the silicon carbide semiconductor portion can be prevented.

The method of manufacturing a semiconductor device according to the present invention achieves an effect in that an ohmic contact of low contact resistivity can be formed and device properties can be prevented from degrading.

As described, the method of manufacturing a semiconductor device according to the present invention is suitable for power semiconductor devices used in a semiconductor device that uses a silicon carbide semiconductor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, comprising:
   providing a semiconductor substrate including silicon carbide;
   forming a transition metal layer on a surface of the semiconductor substrate; and
   exposing the semiconductor substrate having the transition metal layer formed thereon to a hydrogen plasma atmosphere formed by microwaves to cause the transition metal layer that receives energy released when the hydrogen atoms are adsorbed by the transition metal layer to have a temperature of 1000° C. or more, the hydrogen plasma atmosphere being formed using a microwave electrical power of 500 w or more and a pressure of hydrogen gas of 10 Pa or more and 100 Pa or less so as to prevent the heat generated by the transition metal layer during plasma processing from conducting throughout the silicon carbide,
   wherein, during said exposing the semiconductor substrate, a portion of the semiconductor substrate contacting the transition metal layer is heated by a transfer of heat from the transition metal layer and, at an interface of the transition metal layer and the semiconductor substrate, an ohmic contact is formed by reaction of the transition metal layer and the semiconductor substrate.

2. The method according to claim 1, further comprising forming on the semiconductor substrate, before said forming a transition metal layer, a metal layer that has a lower melting point than that of the transition metal layer,
   wherein, during said forming a transition metal layer, the transition metal layer is formed to cover the metal layer and, during said exposing the semiconductor substrate, the semiconductor substrate having the metal layer and the transition metal layer formed thereon is exposed to the hydrogen plasma atmosphere to cause the transition metal layer to generate heat and heat the metal layer by a transfer of the heat from the transition metal layer.

3. The method according to claim 2, wherein the metal layer is one of an aluminum layer, an aluminum alloy layer, a nickel layer, and a nickel alloy layer, and wherein the transition metal layer is one of a titanium layer, a molybdenum layer, and a tungsten layer.

4. The method according to claim 1, wherein the transition metal layer includes a first metal layer and a second metal layer, said surface of the semiconductor substrate includes a front surface and a back surface and said forming a transition metal layer includes:
   forming the first metal layer on the front surface of the semiconductor substrate; and
   forming the second metal layer on the back surface of the semiconductor substrate, and
   wherein, during said exposing the semiconductor substrate, the first metal layer and the second metal layer are simultaneously exposed to the hydrogen plasma atmosphere.

5. The method according to claim 1, wherein the transition metal layer includes a first metal layer and a second metal layer, said surface of the semiconductor substrate includes a front surface and a back surface and said forming a transition metal layer includes:
   forming the first metal layer on the front surface of the semiconductor substrate; and forming the second metal layer on the back surface of the semiconductor substrate, wherein the method further comprises after said forming a transition metal layer and before said exposing the semiconductor substrate, disposing a shielding substrate including a material other than a transition metal so as to cover a surface of the second metal layer, and wherein, during said exposing the semiconductor substrate, the semiconductor substrate having the second metal layer covered by the shielding substrate is exposed to the hydrogen plasma atmosphere.

6. The method according to claim 5, wherein the shielding substrate includes quartz.

7. The method according to claim 5, wherein the shielding substrate includes silicon or a metal other than a transition metal.

8. The method according to claim 1, wherein, during said forming a transition metal layer, the transition metal layer has a thickness that is set such that, during said exposing the semiconductor substrate, the transition metal layer is reacted entirely to end heat generation by the transition metal layer.

9. The method according to claim 8, wherein the thickness of the transition metal layer is at least 10 nm and not more than 200 nm.

10. The method according to claim 8, wherein the thickness of the transition metal layer is at least 20 nm and not more than 100 nm.

11. The method according to claim 1, wherein the transition metal layer is an alloy layer including a transition metal and silicon.

12. The method according to claim 1, wherein the transition metal layer includes one of or an alloy including, as a primary component, at least one of nickel, titanium, molybdenum, silver, and tungsten.

13. The method according to claim 1, wherein, before said forming a transition metal layer, an insulated gate structure is formed in the surface of the semiconductor substrate, the insulated gate structure including an electrical conductor that contacts the semiconductor substrate via an insulating film.

14. The method according to claim 1, wherein the reaction of the transition metal layer and the semiconductor substrate forms a transition metal silicide.

* * * * *